US012581858B2

(12) United States Patent
Shiomi et al.

(10) Patent No.: US 12,581,858 B2
(45) Date of Patent: Mar. 17, 2026

(54) METHOD FOR MANUFACTURING SILICON BULK THERMOELECTRIC CONVERSION MATERIAL, SILICON BULK THERMOELECTRIC CONVERSION MATERIAL, AND THERMOELECTRIC CONVERSION ELEMENT

(71) Applicant: JAPAN SCIENCE AND TECHNOLOGY AGENCY, Kawaguchi (JP)

(72) Inventors: Junichiro Shiomi, Tokyo (JP); Bin Xu, Tokyo (JP); Ryohei Nagahiro, Tokyo (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 0 days.

(21) Appl. No.: 18/819,247

(22) Filed: Aug. 29, 2024

(65) Prior Publication Data

US 2024/0423092 A1     Dec. 19, 2024

Related U.S. Application Data

(63) Continuation of application No. PCT/JP2023/006640, filed on Feb. 24, 2023.
(Continued)

(30) Foreign Application Priority Data

Sep. 21, 2022     (JP) ................................ 2022-150771

(51) Int. Cl.
*H10N 10/851*     (2023.01)
*B82Y 15/00*     (2011.01)
*B82Y 40/00*     (2011.01)

(52) U.S. Cl.
CPC ............ *H10N 10/851* (2023.02); *B82Y 15/00* (2013.01); *B82Y 40/00* (2013.01)

(58) Field of Classification Search
CPC .................................................... H10N 10/851
See application file for complete search history.

(56) References Cited

U.S. PATENT DOCUMENTS

| | | | | |
|---|---|---|---|---|
| 2014/0116491 A1* | 5/2014 | Reifenberg | ........ | H10N 10/8556 216/13 |
| 2016/0247997 A1* | 8/2016 | Liu | ........................ | H10N 10/01 |
| 2021/0057626 A1* | 2/2021 | Shiomi | ................... | C01B 33/02 |

FOREIGN PATENT DOCUMENTS

| | | |
|---|---|---|
| JP | 2015053466 A | 3/2015 |
| JP | 2016504756 A | 2/2016 |
| WO | 2019131795 A1 | 7/2019 |

OTHER PUBLICATIONS

Claudio et al., Nanocrystalline silicon: lattice dynamics and enhanced thermoelectric properties, Royal Society of Chemistry, Physical Chemistry, vol./Issue 16, pp. 25701-25709 (Year: 2014).*
(Continued)

*Primary Examiner* — Jayne L Mershon
(74) *Attorney, Agent, or Firm* — ROSSI, KIMMS & McDOWELL LLP

(57) ABSTRACT

A silicon bulk thermoelectric conversion material having improved thermoelectric performance compared to conventional material is provided. Alternatively, a method for manufacturing a silicon bulk thermoelectric conversion material having improved thermoelectric performance by reducing thermal conductivity compared to the conventional method is provided. A silicon bulk thermoelectric conversion material according to an embodiment of the present invention includes a housing step of putting a silicon powder containing silicon nanoparticles between a first electrode member and a second electrode member of a heating unit, a
(Continued)

150

130

140

120

110

100 heating step of heating the silicon powder by applying current while applying pressure equal to or less than 12 MPa between the first electrode member and the second electrode member and a cooling step of cooling the heated silicon powder.

9 Claims, 8 Drawing Sheets

Related U.S. Application Data

(60) Provisional application No. 63/316,571, filed on Mar. 4, 2022.

(56) References Cited

OTHER PUBLICATIONS

International Search Report issued in Intl. Appln. No. PCT/JP2023/006640 mailed May 23, 2023. English translation provided.
Written Opinion issued in Intl. Appln. No. PCT/JP2023/006640 mailed May 23, 2023.
Shiomi et al., "Bulking and cost reduction of Si nanocomposite sintered bodies; Fabrication of Metal-doped Si Thermoelectric Materials by High Speed Sintering", Presentation slides of JST CREST and PRESTO Symposium in research field of "Research and Development of Innovative Environmental Power Generation Technologies Using Micro Energy", Mar. 7, 2022. English translation provided.
Shiomi et al., "Development of bulk Si thermoelectric materials using strong non-equilibrium", Presentation poster of JST CREST and PRESTO Symposium in research field of "Research and Development of Innovative Environmental Power Generation Technologies Using Micro Energy", Mar. 7, 2022. English translation provided.
Xu et al., "Fabrication of nanocrystal silicon bulk materials with high thermoelectric performance via fast sintering", Proceedings of the 83rd JSAP Autumn Meeting 2022, Aug. 26, 2022. English translation provided.
Shiomi et al., "Innovative Thermoelectric Devices with Mechano-Thermal Functionality", Presentation slides of the 83rd JSAP Autumn Meeting 2022, Sep. 22, 2022. English translation provided.
Xu et al., "Fabrication of nanocrystal silicon bulk materials with high thermoelectric performance via fast sintering", Presentation slides of the 83rd JSAP Autumn Meeting 2022, Sep. 23, 2022. English translation provided.
English translation of Written Opinion issued in Intl. Appln. No. PCT/JP2023/006640, mailed May 23, 2023, previously cited in IDS filed Aug. 29, 2024.

* cited by examiner

100

Fast Sintering Stop          Normal Sintering Stop

Temperature

Displacement

Current

Time

500

METHOD FOR MANUFACTURING SILICON BULK THERMOELECTRIC CONVERSION MATERIAL, SILICON BULK THERMOELECTRIC CONVERSION MATERIAL, AND THERMOELECTRIC CONVERSION ELEMENT

CROSS-REFERENCE TO RELATED APPLICATIONS

This application is a Continuation of International Patent Application No. PCT/JP2023/006640, filed on Feb. 24, 2023, which claims the benefit of priority to U.S. Provisional Patent Application No. 63/316,571, filed on Mar. 4, 2022, and Japanese Patent Application No. 2022-150771, filed on Sep. 21, 2022, the entire contents of which are incorporated herein by reference.

FIELD

The present invention relates to a silicon bulk thermoelectric conversion material.

BACKGROUND

In recent years, many studies have been conducted aiming at improving the performance of thermoelectric conversion materials. Thermoelectric conversion is a technique capable of directly converting heat and electricity to each other, and is capable of generating electricity from a low-temperature heat source such as exhaust heat, which has been difficult to utilize so far, and therefore has attracted attention to be used as an energy harvesting device such as a power source of an IoT sensing device, and the like. The performance of thermoelectric conversion materials is represented by a dimensionless figure of merit ZT.

$$ZT = \frac{S^2\sigma}{\kappa}T \qquad (1)$$

Here, S is the Seebeck coefficient, $\sigma$ is the electrical conductivity, T is the absolute temperature, and k is the thermal conductivity. As is clear from this formula, the performance of the thermoelectric conversion material can be improved by either (1) increasing the Seebeck coefficient S or the electrical conductivity $\sigma$, or (2) reducing the thermal conductivity k.

In recent years, thermoelectric conversion materials with ZT significantly exceeding 1 have been reported by many research groups. On the other hand, in the case of an energy harvesting device, a significant increase in ZT of thermoelectric conversion materials is not essential, and a higher ZT is not necessarily required as long as the manufacturing cost can be kept low. However, most of the studies reported to date have used highly toxic, less environmentally friendly or expensive materials. Therefore, these studies fail to solve the problem of cost-effectiveness described above, and the thermoelectric conversion device has not been widely spread and put into practical use. Here, from the viewpoint of manufacturing cost, silicon is a material having high reserves, non-toxicity, and high stability, and is a promising material as a thermoelectric conversion material because silicon processing technology that is currently in widespread use can be applied. However, the thermal conductivity of silicon is 100 W/m·K or more, and even if it is simply used as a thermoelectric conversion material, ZT is about 0.005 which is not suitable for practical use at all. Therefore, Japanese Laid-Open Patent Publication No. 2016-504756 attempts to reduce the thermal conductivity by using a nanowire having "an aspect ratio of 10 or more" (Claim 1, paragraph [0006] and the like). Further, Japanese Laid-Open Patent Publication No. 2015-053466 has a solution of "a thermoelectric material characterized by consisting mainly of any one of a magnesium-silicon alloy, a magnesium-silicon-tin alloy, a silicon, or a silicon-germanium alloy and being composed of a porous body having a large number of micropores", which means that a thermoelectric material is sought based on an alloy material (such as germanium) because a practical ZT value cannot be obtained with a silicon alone or a lightly doped silicon.

SUMMARY

Japanese Laid-Open Patent Publication No. 2016-504756 attempts to reduce the thermal conductivity by forming nanowires. However, in the case of practical use as a device, since the nanowire is not a practical size, a bulk thermoelectric conversion material is required. On the other hand, it is not easy to manufacture a bulk thermoelectric conversion material using nanowires. Further, as can be seen from the fact that the thermal conductivity is reduced by using an alloy in Japanese Laid-Open Patent Publication No. 2015-053466, the production of a practical thermoelectric conversion material at room temperature has not been achieved with a silicon alone or a material in which silicon is doped with a dopant. Therefore, an object of an embodiment of the present invention is to provide a silicon bulk thermoelectric conversion material with improved thermoelectric performance by reducing thermal conductivity as compared with the conventional material. Another object of an embodiment of the present invention is to provide a method for manufacturing a silicon bulk thermoelectric conversion material with improved thermoelectric performance by reducing thermal conductivity as compared with a conventional method.

According to an embodiment of the present invention, a method for manufacturing a silicon bulk thermoelectric conversion material including a housing step of putting a silicon powder containing silicon nanoparticles between a first electrode member and a second electrode member of a heating unit, a heating step of heating the silicon powder by applying current while applying pressure equal to or less than 12 MPa between the first electrode member and the second electrode member, and a cooling step of cooling the heated silicon powder is provided wherein, the heating unit includes the first electrode member, the second electrode member, and a conductive cylindrical member, and at least one of the first electrode member and the second electrode member is slidably fitted in the conductive cylindrical member.

The heating step may include a step of monitoring a displacement amount of the first electrode member and the second electrode member, and stopping heating when the displacement amount reaches a predetermined value.

The method may further include a step of preparing the silicon powder by mixing the silicon nanoparticles and dopant particles.

An average particle diameter of the silicon nanoparticles may be 100 nm or less.

The dopant particles may be phosphorus microparticles or boron microparticles having an average particle diameter of 100 μm or less.

According to an embodiment of the present invention, a silicon bulk thermoelectric conversion material including a plurality of silicon nanoparticles is provided, wherein the plurality of silicon nanoparticles are joined to each other at a portion of a surface, pores configured to separate surfaces of the plurality of silicon nanoparticles from each other are arranged in the silicon bulk thermoelectric conversion material, the silicon bulk thermoelectric conversion material has a peak at 510 cm$^{-1}$ or more and 520 cm$^{-1}$ or less in a Raman spectrum, and ZT is 0.10 or more at 22° C. or more and 25° C. or less.

The silicon bulk thermoelectric conversion material may further contain 0.1% or more and 10% or less of phosphorus or boron by weight when a weight of the silicon bulk thermoelectric conversion material is taken as 100%.

The silicon bulk thermoelectric conversion material may have thermal conductivity of 3.0 W/m·K or more and 6.0 W/m·K or less, a longitudinal wave propagates at a sound velocity of 5,800 m/s or less, and a transverse wave propagates at a sound velocity of 4,200 m/s or less.

The silicon bulk thermoelectric conversion material may have thermal conductivity of 2.0 W/m·K or more and less than 3.0 W/m·K, a longitudinal wave propagates at a sound velocity of 5,300 m/s or less, and a transverse wave propagates at a sound velocity of 3,400 m/s or less.

The silicon bulk thermoelectric conversion material may have thermal conductivity of 3.0 W/m·K or more and less than 4.0 W/m·K, a longitudinal wave propagates at a sound velocity of 6,100 m/s or less, and a transverse wave propagates at a sound velocity of 3,700 m/s or less.

The silicon bulk thermoelectric conversion material may have thermal conductivity of 4.0 W/m·K or more and 9.0 W/m·K or less, a longitudinal wave propagates at a sound velocity of 6,400 m/s or less, and a transverse wave propagates at a sound velocity of 4,200 m/s or less.

According to an embodiment of the present invention, a silicon bulk thermoelectric conversion material comprising a plurality of silicon nanoparticles is provided, wherein the plurality of silicon nanoparticles are joined to each other at a portion of a surface, pores configured to separate surfaces of the plurality of silicon nanoparticles from each other are arranged in the silicon bulk thermoelectric conversion material, and ZT calculated using electrical conductivity and a Seebeck coefficient measured at any measured ambient temperature in a range of 40° C. to 50° C. is 0.10 or more.

According to an embodiment of the present invention, a thermoelectric conversion element including a member composed of any one of the silicon bulk thermoelectric conversion materials described above is provided, wherein the member has a thickness of 1 mm or more.

DESCRIPTION OF EMBODIMENTS

Figure 1:
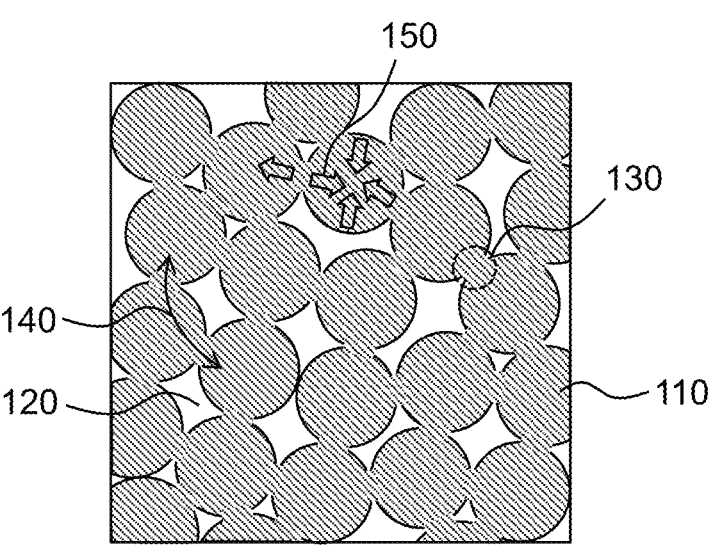
FIG. 1 is a schematic diagram showing a structure of a silicon bulk thermoelectric conversion material 100 according to an embodiment of the present invention.

Hereinafter, embodiments of the present invention will be described with reference to the drawings. However, the present invention can be implemented in many different aspects, and should not be construed as being limited to the description of the embodiments exemplified below. In addition, although the drawings may be schematically represented with respect to the width, thickness, shape, and the like of each part as compared with the actual aspect for clarity of the description, the drawings are merely examples, and do not limit the interpretation of the present invention. In addition, in the present specification and the drawings, the same reference signs are given to the same elements as those previously described with respect to the previous drawings, and detailed description thereof may be omitted as appropriate. In the present specification, in the case where a member or area is "above (or below)" another member or area, it includes not only the case where the member or area is directly above (or below) the other member or region, but also the case where the member or area is above (or below) the other member or region, that is, it includes the case where another component is included between above (or below) the other member or region, unless otherwise limited.

In a nanocrystalline structure, when phonons collide with crystal grain interfaces, some phonons are scattered and some phonons are transmitted. On the other hand, in a nanoporous structure, all phonons impacting on a surface of the pores are scattered. Therefore, it is considered that a use of the nanoporous structure can promote scattering of phonons rather than the nanocrystalline structure, and can reduce thermal conductivity without forming an alloy or a nanowire structure.

In International patent publication No. WO2019/131795, the present inventors have shown that a combination of the nanoporous structure and the nanocrystalline structure enables a significant reduction in thermal conductivity. In International patent publication No. WO2019/131795, it is possible to manufacture a silicon bulk thermoelectric conversion material in which a nanowire array structure is formed by metal-assisted etching of a silicon substrate, and the nanowire array structure is sintered while being crushed into fine particles having a small aspect ratio by plasma sintering while being pressurized.

As a result of further investigation by the present inventors, in the manufacturing method of International patent publication No. WO2019/131795, since the nanowire array structure is sintered while being crushed into fine particles having a small aspect ratio, it has been clarified that thermal conductivity is increased by the disappearance of a part of the nanoporous structure due to melting of the fine particles and grain growth of the nanocrystal structure.

In the present invention, the present inventors have realized low thermal conductivity by reducing a group velocity of phonons by controlling interfaces at which the fine particles of silicon are joined when sintering the fine particles of silicon.

[Configuration of the Present Invention]

FIG. 1 is a schematic diagram showing a structure of a silicon bulk thermoelectric conversion material 100 according to an embodiment of the present invention. Specifically, it has been found that a significant reduction in thermal conductivity is possible by using a nanoporous structure appropriately controlling silicon nanoparticles 110, pores 120 existing between the silicon nanoparticles 110, and joint portions 130 joined to each other at a portion of a surface of the silicon nanoparticle 110. In the present specification, a term "bulk" means that a length in all directions (X-axis direction, Y-axis direction, and Z-axis direction perpendicular to each other) has a size of 1 mm or more.

[Silicon Nanoparticles 110]

In the present embodiment, the silicon nanoparticles 110 of the silicon bulk thermoelectric conversion material 100 have an average size of 5 nm or more and 120 nm or less. The silicon nanoparticles 110 having a size of 34.4 nm or more and 111.6 nm or less are preferable since it is possible to reduce thermal conductivity to 1.47 W/m·K or more and 8.95 W/m·K or less. The size of a silicon nanoparticle means a diameter of a cross-sectional circle of the silicon nanoparticle (if a cross-sectional shape is circular), and a diameter of a circle circumscribing the cross-sectional polygon (if a cross-sectional shape is polygonal. Here, an average value of the sizes of the silicon nanoparticles 110 means a particle size at maximum frequency in a particle size distribution of the silicon nanoparticles 110. In the present invention, the particle size distribution of the silicon nanoparticles 110 can be detected when a predetermined observed area of 0.65 $\mu m^2$ is observed with HAADF-STEM (magnification 200000 times). This observation method can be replaced by any method that allows observation with the same or higher resolution and the same and larger observation area including the observation conditions in the following sections.

[Crystallite Size]

In the present specification, the size of the silicon nanoparticles 110 of the silicon bulk thermoelectric conversion material 100 can also be evaluated by the crystallite size. The crystallite size shall be determined by an X-ray diffraction method (focusing method). The silicon bulk thermoelectric conversion material 100 according to the present embodiment has a crystallite size of 35 nm or more and 120 nm or less.

A particle size distribution of the silicon nanoparticles 110 preferably has a sharp peak. Having such a particle size distribution provides conductivity between the silicon nanoparticles 110 through the joint portions 130 while maintaining the crystal structure of the silicon nanoparticles 110. In addition, since phonons are strongly scattered at an interface between the silicon nanoparticles 110 and the pores 120, the thermal conductivity can be reduced.

[Pore 120]

The pores 120 exist between the silicon nanoparticles 110. The pores 120 strongly scatter phonons at the interface between the silicon nanoparticles 110 and the pores 120 and reduce the thermal conductivity by separating surfaces of the adjacent silicon nanoparticles 110 from each other.

[Aspect Ratio of Silicon Nanoparticles 110]

An aspect ratio of the silicon nanoparticles 110 is 2 or less. The aspect ratio literally refers to a ratio of a long side and a short side in a rectangle, but is not limited to a rectangle in the present specification, and can also be conceived in the case of a circle or a polygon, and a value thereof is calculated by a ratio of a long axis and a short axis of a rectangle circumscribing crystalline silicon nanoparticles. This aspect ratio constraint is an important factor in achieving isotropic and good properties in bulk form. The present silicon bulk thermoelectric conversion material is significantly different from the silicon bulk thermoelectric conversion material described in International patent publication No. WO2019/131795, which is obtained by sintering particles obtained by crushing nanowires having an originally large aspect ratio, in that the silicon bulk thermoelectric conversion material 100 is composed of silicon nanoparticles 110 formed by sintering particles having an originally small aspect ratio as will be described later.

[Joint Portion 130]

In the silicon bulk thermoelectric conversion material 100, the silicon nanoparticles 110 have the joint portions 130 joined to each other at a portion of the surface. The joint portions 130 provide electrical conductivity to the two adjacent silicon nanoparticles 110 by providing localized joining to the two adjacent silicon nanoparticles 110. In the silicon bulk thermoelectric conversion material 100, a conductive path 140 is formed through the joint portion 130. The conductive path 140 formed between the silicon nanoparticles 110 constituting the silicon bulk thermoelectric conversion material 100 imparts conductivity to the entire silicon bulk thermoelectric conversion material 100. On the other hand, as described above, the surfaces of the silicon nanoparticles 110 other than the joint portion 130 maintain the surface structures of the silicon nanoparticles as a raw material, and constitute an interface with the pores 120.

[Dopant]

In an embodiment, the silicon bulk thermoelectric conversion material 100 may include dopants. In the present embodiment, it is preferable that the dopants are arranged in a dispersed manner inside the silicon nanoparticles 110 and substantially uniformly dispersed therein. The dopants may also be arranged as particles including dopants outside the silicon nanoparticles 110 to the extent that the electrical conductivity provided by the silicon nanoparticles 110 is not compromised. As an N-type dopant, phosphorus can be used, and as a P-type dopant, boron can be used. A content of the dopant is 0.01% or more and 10% or less by weight, preferably 0.1% or more and 10% or less, and more preferably 1% or more and 3% or less, when the weight of the silicon bulk thermoelectric conversion material 100 is taken as 100%. In addition, the silicon bulk thermoelectric conversion material 100 is doped by heating during sintering in a manufacturing method described later. Therefore, a part of the dopant added before sintering is sublimated by heating, and a content of the dopant in the silicon bulk thermoelectric conversion material 100 is lower than a content of the dopant added before sintering.

[Properties of Silicon Bulk Thermoelectric Conversion Material]

The silicon bulk thermoelectric conversion material 100 having the configuration described above is composed of a silicon alone, and can realize a property in which ZT exceeds 0.1 in a range of 22° C. or more and 25° C. or less. The silicon alone means that it is not an alloy, although a small amount of impurities is allowed to remain. Further, as described above, a dopant may be included.

Here, in a bulk single crystal, a mean free path of each phonon is determined by phonon-phonon scattering. An effective thermal conductivity can be reduced from thermal conductivity of the bulk single crystal by providing an interface or a surface at intervals shorter than the mean free path.

In the silicon bulk thermoelectric conversion material 100 according to the present embodiment, the structure with reduced thermal conductivity can be maintained, and the conductive path 140 provided by the joint portion 130 can increase the electrical conductivity between the silicon nanoparticles 110 by strongly scattering phonons at the interface between the silicon nanoparticles 110 and the pores 120.

[Tensile Stress]

In the silicon bulk thermoelectric conversion material 100, a tensile stress 150 is generated in an inside of the silicon nanoparticle 110 in a vicinity of the surface of the silicon nanoparticle 110 and a vicinity of the joint portion 130 by applying a manufacturing method described later. In the silicon bulk thermoelectric conversion material 100, in the case where the P-type dopant is included, the tensile stresses of the silicon nanoparticles 110 are, for example, 0.36 GPa or more and 2.43 GPa or less. In the case where the N-type dopant is included, the tensile stresses of the silicon nanoparticles 110 are, for example, 0.36 GPa or more and 0.80 GPa or less. In the present specification, the tensile stress can be evaluated by Raman spectroscopy. A strain caused by the tensile stress 150 generated in the vicinity of the joint portion 130 reduces the thermal conductivity at the joint portion 130. Therefore, in the silicon bulk thermoelectric conversion material 100, it is possible to simultaneously realize two different actions of imparting electrical conductivity by the conductive path in the joint portion 130 and reducing the thermal conductivity by the stress.

[Thermal Conductivity]

In the present specification, the thermal conductivity of the silicon bulk thermoelectric conversion material 100 is calculated by multiplying thermal diffusivity measured by a laser flash method by specific heat capacity and density. the specific heat capacity can be measured, or calculated from literature values of specific heat (for example, Shanks, H. R., Maycock, P. D., Sidles, P. H. & Danielson, G. C. Thermal conductivity of silicon from 300 to 1400° K. Phys. Rev. 130, 1743-1748 (1963)). The silicon bulk thermoelectric conversion material 100 according to the present embodiment has thermal conductivity of 1.0 W/m·K or more and 10.0 W/m·K or less, preferably 3.0 W/m·K or more and 6.0 W/m·K or less. As described above, the thermal conductivity of the silicon bulk thermoelectric conversion material 100 lower than thermal conductivity of the conventional thermoelectric conversion material can be realized by an arrangement of the silicon nanoparticles 110 and the pores 120 and control of the strain caused by the tensile stress 150 generated in the vicinity of the joint portion 130 of the silicon bulk thermoelectric conversion material 100.

[Density]

In the present specification, the density of the silicon bulk thermoelectric conversion material 100 is measured by an Archimedes method. Further, a reference of relative density is the density of silicon single crystals (2.33 g/cm³). In the case where the silicon bulk thermoelectric conversion material 100 according to the embodiment of the present invention includes the P-type dopant, it has density of 1.50 g/cm³ or more and 2.20 g/cm³ or less, preferably 1.90 g/cm³ or more and 2.00 g/cm³ or less. In the case where the silicon bulk thermoelectric conversion material 100 according to the embodiment of the present invention includes the P-type dopant, it has relative density of 67% or more and 95% or less, preferably 82% or more and 86% or less. In addition, in the case where the silicon bulk thermoelectric conversion material 100 according to the embodiment of the present invention includes the N-type dopant, it has density of 1.60 g/cm³ or more and 2.00 g/cm³ or less, preferably 1.80 g/cm³ or more and 1.90 g/cm³ or less. In the case where the silicon bulk thermoelectric conversion material 100 according to the embodiment of the present invention includes the N-type dopant, it has relative density of 70% or more and 91% or less, preferably 78% or more and 83% or less.

[Electrical Conductivity]

In the present specification, electrical conductivity of the silicon bulk thermoelectric conversion material 100 is measured by a DC four-terminal method. In the present embodiment, in the case where the electrical conductivity is measured by the same apparatus as a Seebeck coefficient, as will be described later, the electrical conductivity of the silicon bulk thermoelectric conversion material 100 is measured as the temperature of a measurement atmosphere of a sample in a range of 40° C. or more and 50° C. or less, or in a range of 43° C. or more and 46° C. or less when an external atmosphere temperature is in a range of 22° C. or more and 25° C. or less. In the case where the silicon bulk thermoelectric conversion material 100 includes the P-type dopant, it has electrical conductivity of 770 S/m or more and 26,000 S/m or less, preferably 10,400 S/m or more and 26,000 S/m or less. In addition, in the case where the N-type dopant is included, it has electrical conductivity of 700 S/m or more and 74,300 S/m or less, preferably 40,500 S/m or more and 74,300 S/m or less. In the case where the Seebeck coefficient is constant, the silicon bulk thermoelectric conversion material 100 according to the embodiment of the present invention can realize higher electrical conductivity than the conventional nanostructured silicon bulk thermoelectric conversion material. This maintains the high electrical conductivity in the silicon bulk thermoelectric conversion material 100 because clean interfaces of the silicon nanoparticles 110 are maintained despite the low thermal conductivity.

In the silicon bulk thermoelectric conversion material 100, a non-uniform internal strain resulting from the silicon nanoparticles 110 and a manufacturing method described below greatly reduces a phonon transport velocity. In addition, although phonon thermal conduction is suppressed by softening of the joint portion 130 which is a heat flux path between the silicon nanoparticles 110, inhibition of the electrical conduction by the softening of the joint portion 130 is limited, and thus a high ratio of electrical conductivity to thermal conductivity is realized. Therefore, the softening of the joint portion 130 contributes to high thermoelectric performance in the silicon bulk thermoelectric conversion material 100.

[Seebeck Coefficient]

In the present specification, the Seebeck coefficient of the silicon bulk thermoelectric conversion material 100 is measured by a temperature difference electromotive force method. In the case where the silicon bulk thermoelectric conversion material 100 includes the P-type dopant, it has a Seebeck coefficient of 50 μV/K or more and 200 μV/K or less, preferably 100 μV/K or more and 120 μV/K or less. In the case where the N-type dopant is included, it has a Seebeck coefficient of 100 μV/K or more and 350 μV/K or less, preferably 100 μV/K or more and 210 μV/K or less. In addition, in a measurement of the Seebeck coefficient, a sample is sandwiched between upper and lower blocks to set a temperature difference of 30° C. to 40° C. between a high-temperature side end and a low-temperature side end of the sample by heating one block which is selected from the upper and lower blocks, and the temperature and thermo-electromotive force of the two thermocouples (high-temperature side and low-temperature side) connected between both ends are measured. Therefore, the silicon bulk thermoelectric conversion material 100 has a temperature of a measurement atmosphere of a sample in a vicinity of the thermocouples of, for example, 40° C. or more and 50° C. or less, or a temperature of 43° C. or more and 46° C. or less, even when the measurement is performed at a room temperature of 22° C. to 25° C.

[ZT]

Although the Seebeck coefficient of the silicon bulk thermoelectric conversion material 100 is not higher than a Seebeck coefficient of the conventional thermoelectric conversion material, a high ZT of 0.10 or more can be realized in a range of 22° C. or more and 25° C. or less because of the high electrical conductivity of the silicon bulk thermoelectric conversion material 100 described above. When the temperature of the measuring atmosphere at the time of measuring the electrical conductivity is in a range of 40° C. or more and 50° C. or less, or in a range of 43° C. or more and 46° C. or less, the silicon bulk thermoelectric conversion material 100 has the high ZT of 0.10 or more.

[Sound Velocity]

In the present specification, a sound velocity propagating in the silicon bulk thermoelectric conversion material 100 is measured by an ultrasonic velocity measuring method. The silicon bulk thermoelectric conversion material 100 has thermal conductivity of 1.0 W/m·K or more and 10.0 W/m·K or less, preferably 3.0 W/m·K or more and 6.0 W/m·K or less. A longitudinal wave in the silicon bulk thermoelectric conversion material 100 propagates at a sound velocity of 6,400 m/s or less, preferably 5,800 m/s or less. A transverse wave in the silicon bulk thermoelectric conversion material 100 propagates at a sound velocity of 4,200 m/s or less. As shown in the examples described below, the silicon bulk thermoelectric conversion material 100 according to the present embodiment has lower sound velocities of longitudinal and transverse waves when in the same range of thermal conductivity as conventional silicon bulk thermoelectric conversion materials. Therefore, although lower limits of the sound velocity of the longitudinal wave and the sound velocity of the transverse wave are not particularly limited, for example, the longitudinal wave propagates at the sound velocity of 4,000 m/s or more, and the transverse wave propagates at the sound velocity of 2,500 m/s or more. In an embodiment, the silicon bulk thermoelectric conversion material 100 has thermal conductivity within a range of 2.0 W/m·K or more and less than 3.0 W/m·K, the longitudinal wave propagates at a sound velocity of 5,300 m/s or less, and the transverse wave propagates at a sound velocity of 3,400 m/s or less. For example, the longitudinal wave propagates at a sound velocity of 4,700 m/s or more, and the transverse wave propagates at a sound velocity of 3,000 m/s or more. In addition, in an embodiment, the silicon bulk thermoelectric conversion material 100 has thermal conductivity within a range of 3.0 W/m·K or more and less than 4.0 W/m·K, the longitudinal wave propagates at a sound velocity of 6, 100 m/s or less, and the transverse wave propagates at a sound velocity of 3,700 m/s or less. For example, the longitudinal wave propagates at a sound velocity of 5,000 m/s or more, and the transverse wave propagates at a sound velocity of 3,200 m/s or more. Further, in an embodiment, the silicon bulk thermoelectric conversion material 100 has thermal conductivity within a range of 4.0 W/m k or more and 9.0 W/m k or less, the longitudinal wave propagates at a sound velocity of 6,400 m/s or less, and the transverse wave propagates at a sound velocity of 4,200 m/s or less. For example, the longitudinal wave propagates at a sound velocity of 5,200 m/s or more, and the transverse wave propagates at a sound velocity of 3,300 m/s or more. The silicon bulk thermoelectric conversion material 100 having such a sound velocity is preferable because it has a strain inside the silicon nanoparticles 110.

[Manufacturing Method]

Figure 2:
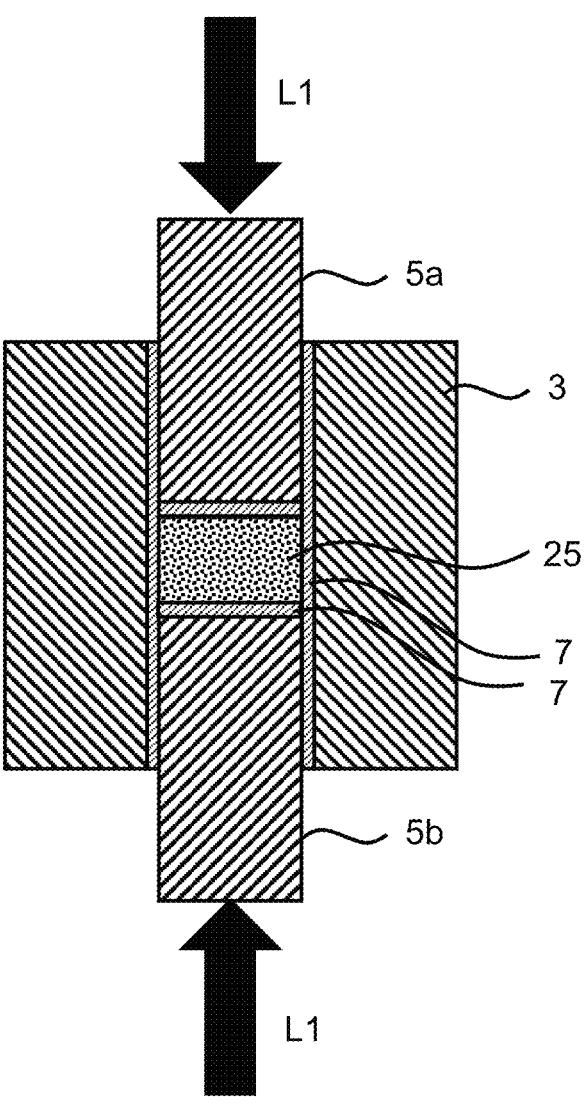
FIG. 2 is a schematic diagram showing a spark plasma sintering apparatus 1 (heating unit) according to an embodiment of the present invention.

FIG. 2 is a schematic diagram showing a spark plasma sintering apparatus 1 (heating unit) according to an embodiment of the present invention. In the present manufacturing method, a heating step (a step of pressurizing and plasma sintering) can be performed by using the spark plasma sintering apparatus 1. The spark plasma sintering apparatus 1 includes, for example, a die 3 of a cylindrical member, and a cylindrical first electrode member (first punch 5a) and a cylindrical second electrode member (second punch 5b) arranged in contact with an inside of the die 3 and movable in the vertical direction (direction L1). The first punch 5a and the second punch 5b are arranged inside of the die 3 so as to face in the direction L1. In the spark plasma sintering apparatus 1, at least one of the first punch 5a and the second punch 5b is slidably fitted into the die 3. In a space surrounded by the die 3 and the first punch 5a and the second punch 5b, a silicon powder 25 including silicon nanoparticles as a raw material is contained. Further, although not shown, a first electrode is connected to an end portion of the first punch 5a located outside the die 3. Similarly, a second electrode is connected to an end of the second punch 5b located outside the die 3. Spacers may be arranged between the first punch 5a and the first electrode and between the second punch 5b and the second electrode, respectively.

In an embodiment, a carbon sheet 7, which is a protective material, is preferably arranged between the die 3 and the first punch 5a, between the die 3 and the second punch 5b, between the first punch 5a and the silicon powder 25, and between the second punch 5b and the silicon powder 25.

In an embodiment, the step of pressurizing and plasma sintering is performed at a sample temperature (temperature of the silicon powder 25 or inner temperature of the die 3) of 800° C. or more and 1200° C. or less by energization heating, and a pressure at the time of pressurization by the first punch 5a and the second punch 5b in the direction L1 of 0.3 MPa or more and 12.0 MPa or less, preferably 3.0 MPa or less.

A typical sintered body forms a dense structure having high density by increasing pressure in a pressurizing and plasma sintering step. In addition, in international patent publication No. WO2019/131795, for the purpose of crushing nanowire array structures, the nanowire array structures were pressurized at 50 MPa or more and 200 MPa or less. When a powder sample is pressurized with high pressure, current does not flow through the powder sample but flows through a die, and the temperature of a heating unit rises. Therefore, the temperature starts to increase from the outside of the powder sample in contact with the die, and it takes a long time to reach sintering temperature. Further, in a cooling step, the temperature of a silicon bulk thermoelectric conversion material after sintering starts to decrease from the heating unit, and the cooling step takes a long time. The present inventors have found that grain growth occurs and the thermal conductivity increases during a heating step and a cooling step over an extended period of time.

Figure 3:
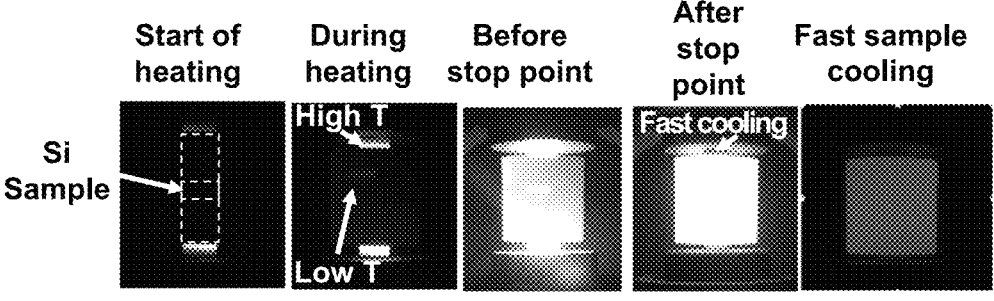
FIG. 3 is a diagram showing a method for manufacturing the silicon bulk thermoelectric conversion material 100 according to an embodiment.

FIG. 3 is a diagram showing a method for manufacturing the silicon bulk thermoelectric conversion material 100 according to an embodiment. In FIG. 3, a solid line represents a method for manufacturing the silicon bulk thermo-electric conversion material 100 according to the present embodiment, and a broken line represents a method according to a conventional sintering method. In the present embodiment, in order to suppress grain growth occurring during a heating step and a cooling step, high-speed sintering and high-speed cooling are applied. Further, in the conventional sintering method, the temperature is raised to a predetermined temperature, maintained for a predetermined time, and then the current is turned off. On the other hand, in the sintering method of the present embodiment, the current is turned off when a predetermined displacement amount is reached, thereby making it possible both to control thermal conductivity of the sintered body and to achieve high-speed sintering and cooling. Although the predetermined displacement amount varies depending on a filling amount of the silicon nanoparticles serving as a raw material, an inner diameter of the die 3 used for sintering, and an initial powder compacting condition, in an embodiment, based on a relationship between the displacement amount and the thermal conductivity (see Examples 1 and 3 and FIG. 5 to be described later), for example, the predetermined displacement amount is determined by a displacement amount corresponding to a particular thermal conductivity of 3.0 W/m·K or more and 6.0 W/m·K or less. Alternatively, in the case where silicon nanoparticles of 0.3 g having an average particle diameter of 10 nm or 30 nm are filled into the die 3 having an inner diameter of 10 mm and heated at using a current of 1000 A while being pressurized with 0.1 kN, the predetermined displacement amount is determined between 1.5 mm to 2.5 mm or between 0.1 mm to 1.6 mm, respectively. In the present embodiment, the displacement amount of the first punch 5a and the second punch 5b is monitored, and when the displacement amounts reach predetermined values, the heating is stopped, whereby the cooling is performed. The thermal conductivity of the silicon bulk thermoelectric conversion material 100 can be controlled by such control based on the displacement amount.

In order to realize high-speed sintering, heating is promoted at the surface where the silicon nanoparticles 110 come into contact with each other by suppressing electrical conduction from the first punch 5a to the second punch 5b through the die 3, and promoting electrical conduction from the first punch 5a to the second punch 5b through the silicon powder 25. Such electrical conduction can be realized by pressurizing the silicon powder 25 at low pressure that is not conventional as described above. In an embodiment, current is applied between the first punch 5a and the second punch 5b while applying pressure of 12 MPa or less, preferably 10 MPa or less, 5 MPa or less, or less than 3 MPa. In the present embodiment, the silicon powder 25 itself arranged inside the heating unit is heated in order to promote heating at surfaces where the silicon nanoparticles 110 come into contact with each other.

Therefore, as shown in FIG. 3, in the method for manufacturing the silicon bulk thermoelectric conversion material 100 according to the present embodiment, an amount of current is increased more rapidly than a conventional method and the silicon powder 25 is rapidly heated to sintering temperature. Further, due to use of the powder as a raw material, the first punch 5a or the second punch 5b moves faster than in a conventional method as the sintering proceeds, and the silicon bulk thermoelectric conversion material 100 is molded.

Further, in the present embodiment, since the electrical conduction from the first punch 5a to the second punch 5b through the die 3 is suppressed, the temperature rise of the die 3 is also suppressed. Thus, heat of the sintered silicon bulk thermoelectric conversion material 100 is released to the die 3 at a relatively low temperature and further released to the outside of the heating unit by interrupting the current to the first punch 5a or the second punch 5b after sintering. Therefore, in the present embodiment, the silicon bulk thermoelectric conversion material 100 can be rapidly cooled, which is not conventional, and grain growth can be suppressed. Such rapid cooling creates large tensile stresses near the surface of the silicon nanoparticles 110.

In the present embodiment, it is possible to increase uniformity of the sintering temperature of the silicon powder 25 by heating the silicon powder 25 to a temperature range of 800° C. or more and 1200° C. or less, and as a result, a silicon bulk thermoelectric conversion material 100 having a ZT exceeding 0.1 in a range of 22° C. or more and 25° C. or less can be produced. In addition, in the case where the heating temperature of the silicon powder 25 is less than 800° C., the silicon nanoparticles constituting the silicon powder 25 cannot be joined to each other, and porosity of the silicon powder 25 does not decrease, so that a sintered body cannot be obtained. On the other hand, when the temperature of the silicon powder 25 exceeds 1200° C., the silicon nanoparticles constituting the silicon powder 25 are melted, the pores 120 between the silicon nanoparticles 110 are reduced or eliminated, and the silicon bulk thermoelectric conversion material 100 according to the present invention in which ZT exceeds 0.1 in the range of 22° C. or more and 25° C. or less cannot be obtained. As used in the present specification, "sintering temperature" is the maximum temperature reached during sintering and is evaluated by the temperature of the die 3 as measured by a radiation thermometer. In addition, time for the step of pressurizing and plasma sintering depends on an amount of the silicon powder 25 to be filled, but is preferably performed within 90 seconds or more and 150 seconds or less. In the present specification, sintering time when the silicon bulk thermoelectric conversion material 100 is manufactured is the time from the start of sintering until the time at which the current of the spark plasma sintering apparatus 1 is cut.

In the present embodiment, sizes of the silicon nanoparticles contained in the silicon powder 25 are preferably 10 nm or more and 50 nm or less. In the present specification, the particle diameter of the silicon nanoparticles included in the silicon powder 25 is measured by the focusing method of X-ray diffraction. Further, in an embodiment, the silicon powder 25 may include the dopant described above.

[Thermoelectric Conversion Element]

Figure 4:
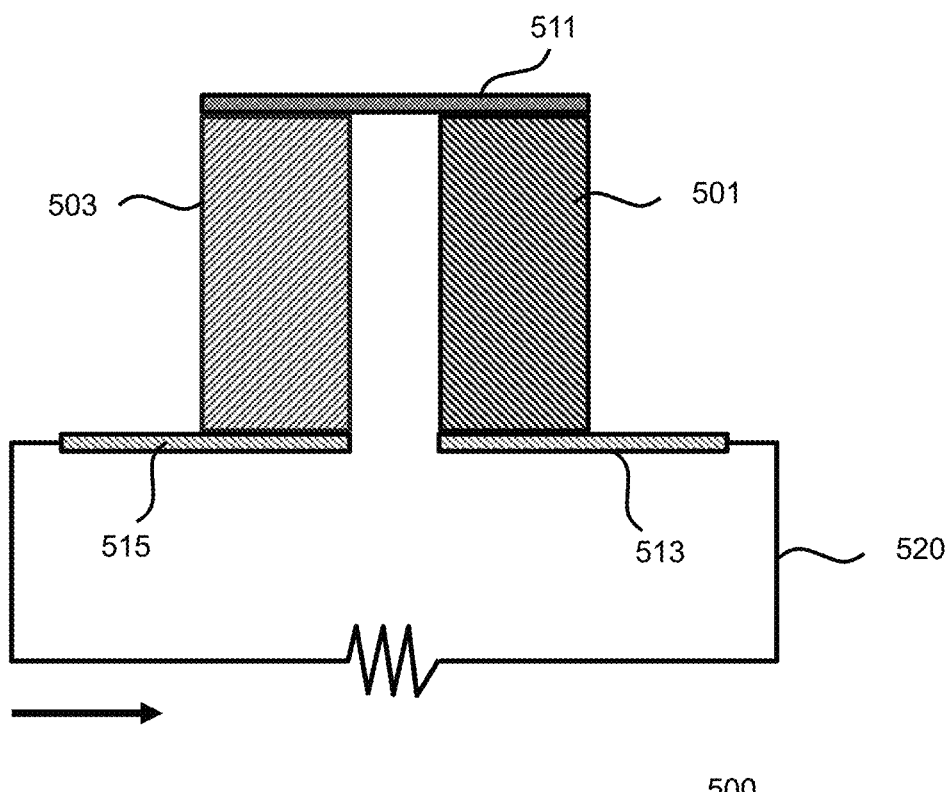
FIG. 4 is a schematic diagram showing a thermoelectric conversion element 500 according to an embodiment of the present invention.

FIG. 4 is a schematic diagram showing a thermoelectric conversion element 500 according to an embodiment of the present invention. The thermoelectric conversion element 500 includes an N-type thermoelectric conversion material molded member 501, a P-type thermoelectric conversion material molded member 503, a first electrode 511 connecting a first end portion of the N-type thermoelectric conversion material molded member 501 and a first end portion of the P-type thermoelectric conversion material molded member 503, a second electrode 513 arranged at a second end portion opposed to the first end portion of the N-type thermoelectric conversion material molded member 501, and a third electrode 515 arranged at a second end portion opposed to the first end portion of the P-type thermoelectric conversion material molded member 503. The second electrode 513 and the third electrode 515 are connected to a wiring 520. In FIG. 4, the first electrode 511 is at a high temperature, the second electrode 513 and the third electrode 515 are at a low temperature, and a direction of current is indicated by an arrow. The N-type thermoelectric conversion material molded member 501 is a member formed by molding the thermoelectric conversion material doped with the N-type dopant described in the embodiment described above into a shape to be applied to the thermoelectric conversion element 500. Further, the P-type thermoelectric conversion material molded member 503 is a member formed by molding the thermoelectric conversion material doped with the P-type dopant described in the embodiment described above into a shape to be applied to the thermoelectric conversion element 500. In an embodiment, the N-type thermoelectric conversion material molded member 501 and the P-type thermoelectric conversion material molded member 503 have thicknesses of 1 mm or more. The silicon bulk thermoelectric conversion material described above can be suitably used for such a member having the thickness of 1 mm or more.

EXAMPLES

In Example 1, using a plasma high-speed spark sintering apparatus (manufactured by Sinterland Co., Ltd., LABOX-300 series), a silicon powder (2% phosphorus by weight) obtained by mixing silicon nanoparticles of 0.3 g (average particle diameter: 10 nm) and phosphorus microparticles of 0.006 g (average particle diameter: 45 μm) was housed in a space surrounded by a graphite molded die 3 having inner diameter of 10 mm and the first punch 5a and the second punch 5b, and heated at a current of 1000 A (current application rate of 1000 A/90 s) while pressurizing with 1.27 MPa (0.1 kN). The energization was stopped as soon as the displacement amount between the first punch 5a and the second punch 5b reached a set value between 1.5 mm to 2.5 mm (temperature of about 980° C. to 1250° C. by the radiation thermometer) and were cooled to obtain a plurality of silicon bulk thermoelectric conversion materials with differing thermal conductivities represented by in FIG. 5. Sintering time was about 90 seconds to 150 seconds. In addition, the sintering time is the time from the start of sintering until the time at which current of the high-speed spark plasma sintering apparatus is cut.

A silicon bulk thermoelectric conversion material of Example 2 was obtained in the same manner as in the Example 1, except that silicon powder (2% boron by weight) obtained by mixing boron microparticles (average particle diameter: 45 μm) was used instead of phosphorus microparticles as the Example 2.

The lower part of FIG. 3 shows the results of a measurement using the radiation thermometer. The lower part of FIG. 3 shows the state of heating of the graphite molded die 3 and the silicon powder during sintering. In the sintering of the present example, the current flows from the first punch 5a to the second punch 5b selectively through the silicon powder due to lower pressure toward the direction L1 during electrical conduction. Therefore, as shown in "Start heating" of FIG. 3, a central portion is heated to red-hot state. Thereafter, a surrounding graphite mold is also heated as in "During heating" of FIG. 3. Compared with the prior art, adhesion between both the first punch 5a and the second punch 5b and the graphite molded die 3 is low and the current flowing through the die 3 is suppressed. We therefore observe the temperature of the surrounding graphite mold is low and not red-hot. As in "Before stop point" of FIG. 3, immediately before the sintering is stopped, the die 3 is also sufficiently heated, and also in this case it can be confirmed that the temperature of the central portion is high as can be seen from a difference in emission strength of the first punch 5a and the second punch 5b and the die 3. After sintering ("After stop point" and "Fast sample cooling" of FIG. 3), the die 3 around the silicon powder is cooler than in the prior art, which contributes to cooling the silicon powder which is at a higher temperature. In addition, since a water-cooled electrode adjacent to the punch has a low temperature, it contributes to cooling of a sample through a spacer.

As Example 3, a silicon powder (2% phosphorus by weight) obtained by mixing silicon nanoparticles of 0.3 g (average particle diameter: 30 nm) and phosphorus microparticles of 0.006 g (average particle diameter: 45 μm) was used, and the mixture was heated at a current of 850 A (current application rate 850 A/90 s) while pressurizing with 1.27 MPa (0.1 kN). A plurality of silicon bulk thermoelectric conversion materials having different thermal conductivities represented by Δ in FIG. 5 were manufactured by stopping the electrical conduction and starting the cooling as soon as a displacement amount of the first punch 5a and the second punch 5b reached a set value between 0.1 mm to 1.6 mm.

[Relationship Between Displacement Amount of Punch and Thermal Conductivity]

The thermal conductivity of the silicon bulk thermoelectric conversion materials of the Example 1 and the Example 3 was measured by a laser flash method. Specifically, thermal diffusivity was determined by observing a state of thermal diffusion by irradiating a pulse laser uniformly on one side of a silicon bulk thermoelectric conversion material, instantaneous heating, and measuring a temperature change on the other side. A blacking treatment was performed on both surfaces of the silicon bulk thermoelectric conversion material using graphite spray to enhance absorption of the pulse laser before measurement. The measurement was carried out under vacuum conditions, and the measurement was carried out while changing the temperature conditions (room temperature up to 500° C.). The thermal diffusivity was obtained by fitting data obtained by the measurement using an analytical model. Specific heat capacity was calculated from a literature value of specific heat, and thermal conductivity was calculated from a product of the thermal diffusivity, the specific heat capacity and the density.

Figure 5:
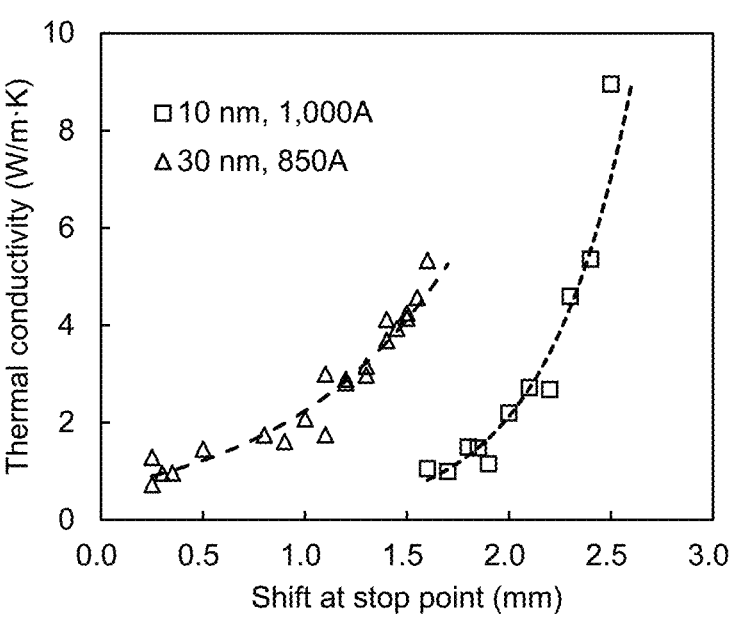
FIG. 5 is a diagram showing a relationship between displacement amounts of a first punch 5a and a second punch 5b and thermal conductivity.

FIG. 5 shows a relationship between the displacement amount of the first punch 5a and the second punch 5b and thermal conductivity of the obtained silicon bulk thermoelectric conversion material. As shown in FIG. 5, it is clear that the thermal conductivity is reduced in the silicon bulk thermoelectric conversion material in which the displacement amount between the first punch 5a and the second punch 5b is small. From this result, it is presumed that the displacement amount affects the structure of the joint portion 130 between the silicon nanoparticles 110 by controlling porosity of the pores 120 existing between the silicon nanoparticles 110, and a strain caused by the tensile stress 150 generated in the vicinity of the joint portion 130 contributes to the control of thermal conductivity at the joint portion 130. That is, in the method for manufacturing the silicon bulk thermoelectric conversion material of the present embodiment, the thermal conductivity can be controlled by the displacement amount.

[Measurement of Electrical Conductivity and Seebeck Coefficient]

Electrical conductivity (electrical resistivity) and a Seebeck coefficient were measured using a thermoelectric evaluation apparatus ZEM-3 of ULVAC, Inc. In the measurement using the thermoelectric evaluation apparatus, the silicon bulk thermoelectric conversion material was pro cessed into a strip shape, and electrodes were arranged so as to face end portions of the silicon bulk thermoelectric conversion material in a longitudinal direction, and the measurement was performed. In the thermoelectric evaluation apparatus, measurement methods of electrical conductivity (electrical resistivity) and a Seebeck coefficient were measured by a four-terminal method and the temperature difference electromotive force method, respectively. Resistance values of the silicon bulk thermoelectric conversion materials of the Example 1 and the Example 2 are low, and in the case of measurement by a two-terminal method, values of the contact resistance and wiring resistance of a lead wire are also included in the measurement results. Since their influence on the silicon bulk thermoelectric conversion material is large, it is not possible to accurately measure the resistance value of the silicon bulk thermoelectric conversion material. On the other hand, in the four-terminal method, it is possible to separate the resistance values of the contact resistance and the wiring resistance of the lead wire and the resistance value of the silicon bulk thermoelectric conversion material by dividing the lead wire for flowing the current and the lead wire for measuring the voltage, and accurate measurement becomes possible. In the temperature difference electromotive force method for measuring the Seebeck coefficient, a steady heat flow was generated for a silicon bulk thermoelectric conversion material, and a temperature difference was applied to both ends of the silicon bulk thermoelectric conversion material to generate a thermoelectromotive force, a temperature difference ($\Delta T$) and a potential difference ($\Delta V$) were measured by a probe, and the Seebeck coefficient was calculated by the following equation.

$$S = \Delta V / \Delta T$$

In this measurement, the silicon bulk thermoelectric conversion materials of the Example 1 were fabricated into 1 to 3 mm×1 to 3 mm×6 to 8 mm and the sides were polished before being placed in the apparatus. In the measurement, the inside of a chamber was replaced with He gas, and the measurement was performed in a temperature range from room temperature to about 500° C. In this case, the temperature differences between the upper and lower electrodes at each temperature to be measured were set to be 30° C., 35° C., and 40° C., and average values of the Seebeck coefficient and electrical resistivity obtained at each temperature difference was adopted. In addition, measured ambient temperature at this time was 50° C. or less.

Figure 6A:
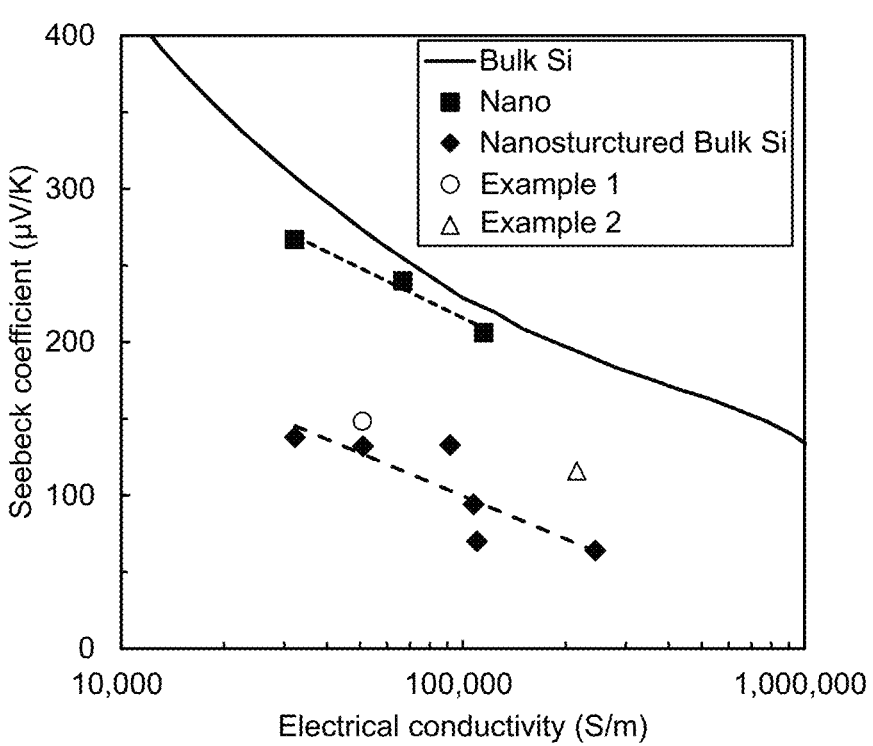
FIG. 6A is a diagram showing a relationship between a Seebeck coefficient and electrical conductivity of a silicon bulk thermoelectric conversion material.
Figure 6B:
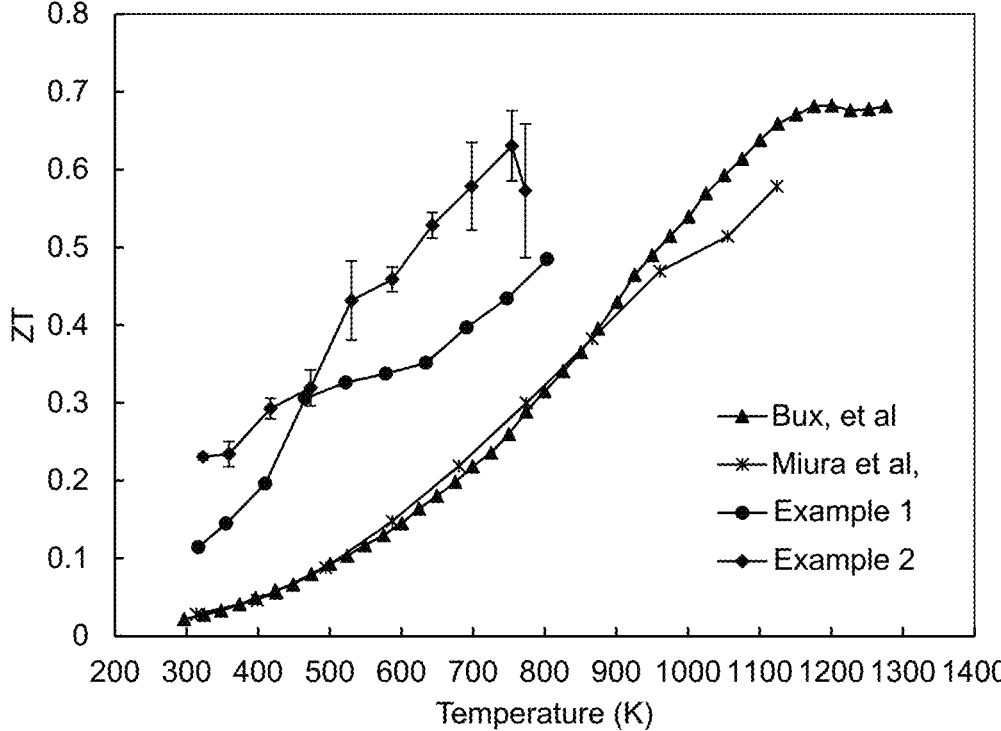
FIG. 6B is a diagram showing a relationship between temperature and ZT of a silicon bulk thermoelectric conversion material.

FIG. 6A shows a relationship of a Seebeck coefficient with respect to electrical conductivity. Further, FIG. 6B is a diagram showing a relationship of ZT with respect to temperature. The silicon bulk thermoelectric conversion materials of the Example 1 and the Example 2 showed higher electrical conductivity compared with the known nanostructured bulk silicon when the Seebeck coefficient was the same as that of the known nanostructured bulk silicon. In addition, the silicon bulk thermoelectric conversion materials of the Example 1 and the Example 2 showed excellent performance with ZT of 0.10 or more at 22° C. or more and 25° C. or less.

[X-Ray Diffraction (XRD)]

A crystallite size was calculated using the Scherrer's formula from a half width of a peak measured from the silicon bulk thermoelectric conversion material by the focusing method of an X-ray diffraction method. In silicon bulk thermoelectric conversion materials exhibiting the best properties, a crystallite size was 35 nm in the silicon bulk thermoelectric conversion material doped with the N-type dopant, and a crystallite size was 48 nm in the silicon bulk thermoelectric conversion material doped with the P-type dopant, indicating that grain growth was suppressed by high-speed sintering.

[Raman Spectroscopy]

Figure 7A:
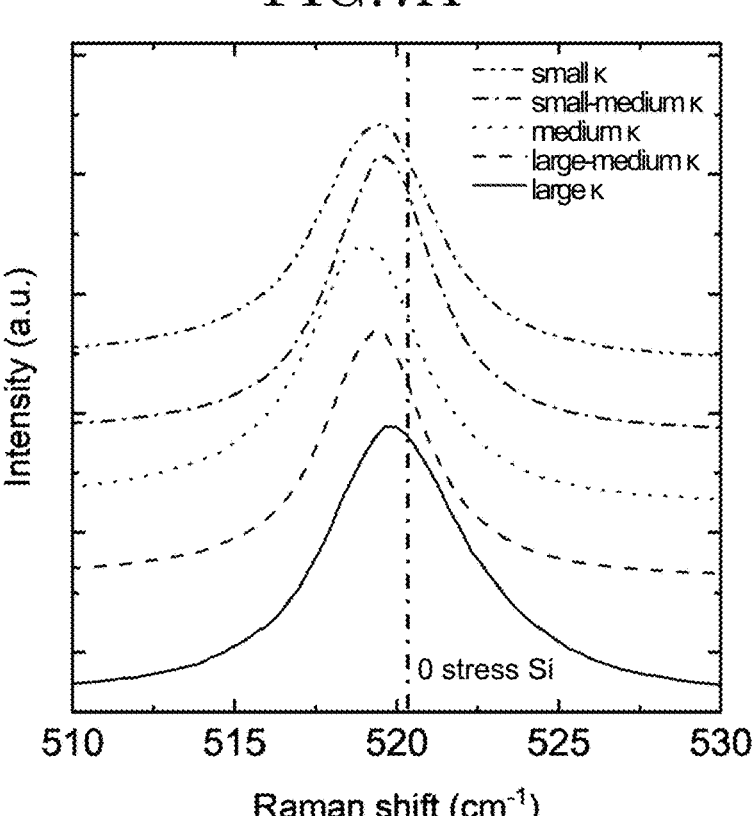
FIG. 7A is a diagram showing a Raman spectrum of a silicon bulk thermoelectric conversion material.

Raman spectra of silicon bulk thermoelectric conversion materials were obtained using a Raman spectroscopy (In-Via® micro Raman system manufactured by Renishaw) with a laser wave length of 532 nm and grating of 3000. The Raman spectrum is shown in FIG. 7A. FIG. 7A shows Raman spectrums from low thermal conductivity silicon bulk thermoelectric conversion materials to high thermal conductivity silicon bulk thermoelectric conversion materials. It was confirmed in FIG. 7A that large tensile stresses remained after the bonding of the silicon nanoparticles by high-speed sintering. On the other hand, in the case of a silicon bulk thermoelectric conversion material having a thermal conductivity of a certain value or less, since the silicon nanoparticles are not sufficiently joined by sintering, the remaining tensile stresses are reduced, and a peak shift (being returned) toward 520 cm$^{-1}$ is confirmed.

As a Comparative example 1, using a plasma high-speed spark sintering apparatus (manufactured by Sinterland Co., Ltd., LABOX-300 Series), a silicon powder (2% phosphorus by weight) obtained by mixing silicon nanoparticles of 0.3 g (average particle size: 10 nm) and phosphorus micropartickes of 0.006 g (average particle size: 45 μm) was added to the graphite molded die 3 having inner diameter of 10 mm, and was raised at 300° C./min while pressurizing with 50 MPa (4.2 kN). The temperature was measured by a thermocouple, and when the temperature reached the set temperature between 980° C. and 1100° C., the heating was maintained at that temperature for 10 minutes, and then energization was stopped and cooling was started to sinter, thereby obtaining a plurality of kinds of silicon bulk thermoelectric conversion materials having different thermal conductivity. The application time of a current was 780 seconds or more.

[Sound Velocity Measurement]

A sound velocity of the silicon bulk thermoelectric conversion material of the Example 1 was measured using an ultrasonic thickness meter (38DLP-X-J-MT-JA, Evident Corporation). A sound velocity of the silicon bulk thermoelectric conversion material of the Comparative example 1 was also measured. The probes used in the measurement were V222-BB (20 MHz, transverse wave) and V1091 (5 MHZ, longitudinal wave). In order to improve the adhesion between the silicon bulk thermoelectric conversion material and the probe, SH-W25 and B2 gels were applied, respectively, and the measurement was performed in sound velocity measurement mode. In a sound velocity measurement mode, an actual measured value of a thickness was input, and propagation time was measured, whereby the sound velocity was calculated by the following formula.

$$\text{Sound velocity} = \text{thickness} \times 2/\text{propagation time}$$

In addition, the reason why the frequency of the probe of the transverse wave is high is that it is difficult to distinguish between a reflected peak and a first excitation peak when measuring a thin sample, and therefore a high-frequency probe is adopted. In theory, an interface/porosity contributes only to attenuation of the sound velocity signal and does not affect the sound velocity itself. However, it is presumed that the interface effectively affects the sound velocity, because in some cases, the interface is not sharp, but may contain differences in surface properties and amorphous phases.

Figure 7B:
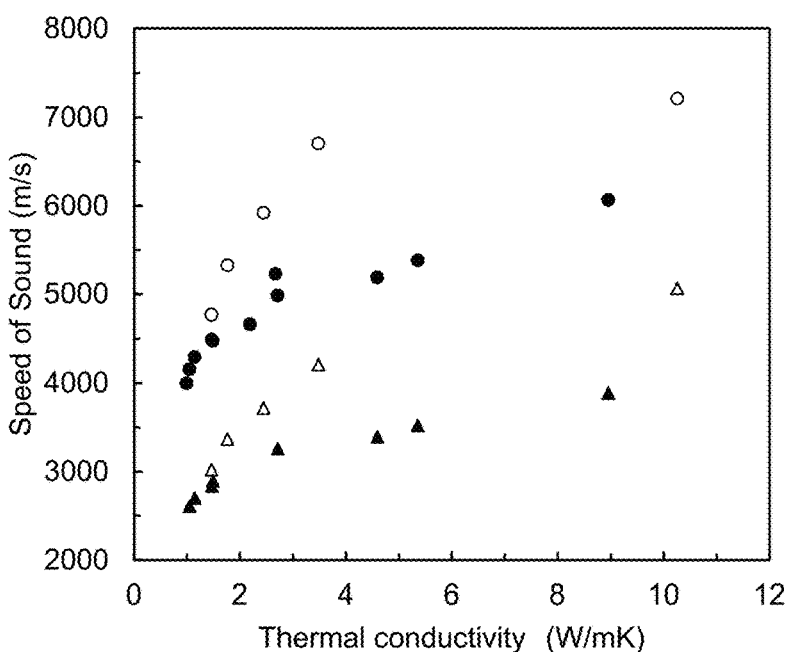
FIG. 7B is a diagram showing a plot of a sound velocity versus thermal conductivity of a silicon bulk thermoelectric conversion material.

FIG. 7B shows a plot of sound velocity versus thermal conductivity. The silicon bulk thermoelectric conversion material of the Example 1 was shown to have a longitudinal wave (LA) having a sound velocity of 6,400 m/s or less and a transverse wave (TA) having a sound velocity of 4,200 m/s or less in the thermal conductivity of 1.0 W/m·K or more and 10.0 W/m·K or less.

Further, from the results in FIG. 7B, a clear difference in sound velocity was observed between the silicon bulk thermoelectric conversion material of the Example 1 and the silicon bulk thermoelectric conversion material of the Comparative example 1. The results in FIG. 7B are summarized in Table 1.

INDUSTRIAL APPLICABILITY

In particular, the fact that nanostructured silicon with high thermoelectric performance could be produced on a bulk scale is extremely useful industrially. Silicon is expected to be a cost-effective thermoelectric material because of its abundant reserves and the availability of conventional semiconductor processes. However, its low thermoelectric performance has prevented it from being put to practical use. The silicon bulk thermoelectric conversion material according to the present invention has succeeded in achieving high performance on a bulk scale, and is an effective means of solving these problems. This is expected to lead to rapid worldwide spread of thermoelectric power generation as an IoT power source, etc.

According to an embodiment of the present invention, a practical silicon bulk thermoelectric conversion material can be provided.

TABLE 1

|  | Example 1 | Comparative example 1 |
|---|---|---|
| Thermal conductivity less than 2 W/m · K | (Transverse) 4000 to 4700 m/s (Longitudinal) 2500 to 3000 m/s | (Transverse) 4750 to 5400 m/s (Longitudinal) 3000 to 3500 m/s |
| Thermal conductivity of 2 to 3 W/m · K | (Transverse) 4700 to 5000 m/s (Longitudinal) 3000 to 3250 m/s | (Transverse) 5400 to 6250 m/s (Longitudinal) 3500 to 3850 m/s |
| Thermal conductivity of 3 to 4 W/m · K | (Transverse) 5000 to 5250 m/s (Longitudinal) 3250 to 3300 m/s | (Transverse) 6250 to 6800 m/s (Longitudinal) 3850 to 4300 m/s |
| Thermal conductivity of 4 to 6 W/m · K | (Transverse) 5200 to 5500 m/s (Longitudinal) 3300 to 3700 m/s | (Transverse) 6800 to 7000 m/s (Longitudinal) 4300 to 4700 m/s |
| Thermal conductivity of 6 to 9 W/m · K | (Transverse) 5500 to 6100 m/s (Longitudinal) 3700 to 3900 m/s | (Transverse) 7000 to 7200 m/s (Longitudinal) 4700 to 5100 m/s |

This difference in sound velocity suggested that a strain exists near grain boundaries of the silicon nanoparticles in the silicon bulk thermoelectric conversion material of the Example 1. It was presumed that the silicon bulk thermoelectric conversion material of the Example 1 had an effect of reducing lattice thermal conductivity due to a lattice softening effect at grain boundaries of joint portions of the silicon nanoparticles, and the effect consequently contributes to the improvement of ZT.

[Uniformity of Silicon Bulk Thermoelectric Conversion Material]

Figure 8:
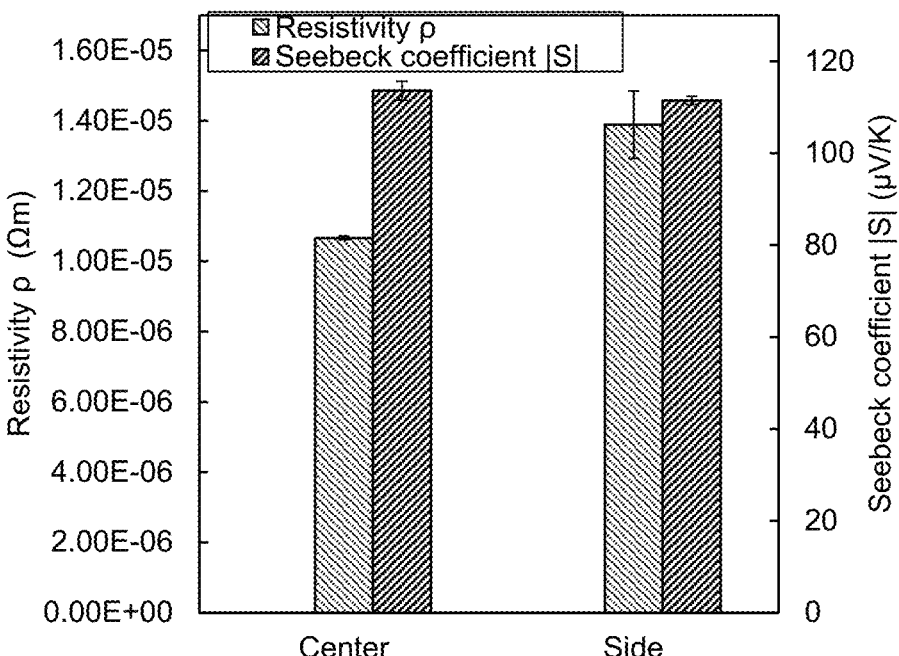
FIG. 8 is a diagram showing uniformity of electrical resistivity and a Seebeck coefficient of a silicon bulk thermoelectric conversion material.

Uniformity was evaluated for the silicon bulk thermoelectric conversion material of the Example 2. The disc-shaped silicon bulk thermoelectric conversion material of Example 2 was cut vertically to produce measurement samples of 1 to 3 mm×1 to 3 mm×6 to 8 mm. Electrical resistance and a Seebeck coefficient were measured for one measurement sample in a central portion and another measurement sample in a side portion adjacent to the central portion. In this case, although the measurement was performed at 25° C., the temperature of the measurement sample became close to 50° C. in order to apply a temperature difference. FIG. 8 shows measurement results. The results in FIG. 8 show that there is less variation in electrical resistance in the central portion than in the side portion. Also, a power factor was reduced by 30% or less in the side portions compared to the central portion. Thus, the uniformity of the silicon bulk thermoelectric conversion material was demonstrated.

What is claimed is:

1. A silicon bulk thermoelectric conversion material comprising a plurality of silicon nanoparticles, wherein the plurality of silicon nanoparticles are joined to each other at a portion of a surface, pores configured to separate surfaces of the plurality of silicon nanoparticles from each other are arranged in the silicon bulk thermoelectric conversion material, the silicon bulk thermoelectric conversion material has a peak at 510 cm-1 or more and 520 cm-1 or less in a Raman spectrum, ZT is 0.10 or more at 22° C. or more and 25° C. or less, the silicon bulk thermoelectric conversion material has a thermal conductivity of 2.0 W/m·K or more and 9.0 W/m·K or less, in a case where the silicon bulk thermoelectric conversion material has thermal conductivity of 2.0 W/m·K or more and less than 3.0 W/m·K, a longitudinal wave sound velocity is 5,300 m/s or less, and a transverse wave sound velocity is 3,400 m/s or less, in a case where the silicon bulk thermoelectric conversion material has thermal conductivity of 3.0 W/m·K or more and less than 4.0 W/m·K, a longitudinal wave sound velocity is 6,100 m/s or less, and a transverse wave sound velocity is 3,700 m/s or less, and in a case where the silicon bulk thermoelectric conversion material has thermal conductivity of 4.0 W/m·K or more and 9.0 W/m·K or less, a longitudinal wave sound velocity is 6.400 m/s or less, and a transverse wave sound velocity is 4,200 m/s or less.

2. The silicon bulk thermoelectric conversion material according to claim 1, further comprising 0.1% or more and 10% or less of phosphorus or boron by weight when a weight of the silicon bulk thermoelectric conversion material is taken as 100%.

3. A thermoelectric conversion element comprising a member composed of the silicon bulk thermoelectric conversion material according to claim 1, wherein the member has a thickness of 1 mm or more.

4. A silicon bulk thermoelectric conversion material comprising a plurality of silicon nanoparticles, wherein the plurality of silicon nanoparticles are joined to each other at a portion of a surface, pores configured to separate surfaces of the plurality of silicon nanoparticles from each other are arranged in the silicon bulk thermoelectric conversion material, ZT calculated using electrical conductivity and a Seebeck coefficient measured at any measured ambient temperature in a range of 40° C. to 50° C. is 0.10 or more, the silicon bulk thermoelectric conversion material has a thermal conductivity of 2.0 W/m·K or more and 9.0 W/m·K or less, in a case where the silicon bulk thermoelectric conversion material has thermal conductivity of 2.0 W/m·K or more and less than 3.0 W/m·K, a longitudinal wave sound velocity is 5,300 m/s or less, and a transverse wave sound velocity is 3,400 m/s or less, in a case where the silicon bulk thermoelectric conversion material has thermal conductivity of 3.0 W/m·K or more and less than 4.0 W/m·K, a longitudinal wave sound velocity is 6,100 m/s or less, and a transverse wave sound velocity is 3,700 m/s or less, and in a case where the silicon bulk thermoelectric conversion material has thermal conductivity of 4.0 W/m·K or more and 9.0 W/m·K or less, a longitudinal wave sound velocity is 6,400 m/s or less, and a transverse wave sound velocity is 4,200 m/s or less.

5. The silicon bulk thermoelectric conversion material according to claim 4, further comprising 0.01% or more and 10% or less of phosphorus or boron by weight when a weight of the silicon bulk thermoelectric conversion material is taken as 100%.

6. The silicon bulk thermoelectric conversion material according to claim 4, wherein the silicon bulk thermoelectric conversion material includes a P-type dopant and a density of the silicon bulk thermoelectric conversion material is 1.50 g/cm3 or more and 2.20 g/cm3 or less.

7. The silicon bulk thermoelectric conversion material according to claim 4, wherein the silicon bulk thermoelectric conversion material includes an N-type dopant and a density of the silicon bulk thermoelectric conversion material is 1.60 g/cm3 or more and 2.00 g/cm3 or less.

8. The silicon bulk thermoelectric conversion material according to claim 4, wherein the plurality of silicon nanoparticles consist of silicon and a P-type dopant, or the plurality of silicon nanoparticles consist of silicon and an N-type dopant.

9. A thermoelectric conversion element comprising a member composed of the silicon bulk thermoelectric conversion material according to claim 4, wherein the member has a thickness of 1 mm or more.

\* \* \* \* \*